United States Patent [19]

Brown

[11] Patent Number: 4,542,343
[45] Date of Patent: Sep. 17, 1985

[54] COMPUTER-CONTROLLED, PORTABLE PULSED NMR INSTRUMENT AND METHOD OF USE WHEREIN DEPOLARIZATION IS ULTRASHORTENED USING PSEUDO RANDOMLY SPACED AND ORIENTED RF DEPOLARIZATION PULSES

[75] Inventor: Robert J. S. Brown, Fullerton, Calif.

[73] Assignee: Chevron Research Company, San Francisco, Calif.

[21] Appl. No.: 505,521

[22] Filed: Jun. 17, 1983

[51] Int. Cl.$^4$ .............................................. G01R 33/08
[52] U.S. Cl. .................................................. 324/307
[58] Field of Search ............... 324/303, 307, 309, 311, 324/312, 313, 319, 320, 206, 346, 377, 306

[56] References Cited

U.S. PATENT DOCUMENTS

| | | | |
|---|---|---|---|
| 3,015,062 | 12/1961 | George et al. | 324/206 |
| 3,581,191 | 5/1971 | Anderson | 324/312 |
| 3,786,341 | 1/1974 | Anderson et al. | 324/311 |
| 4,211,974 | 7/1980 | Henry | 324/377 |

OTHER PUBLICATIONS

Fuller, M., "Magnetic Orientation of Borehole Cores", Geophysics, vol. 34, No. 5, Oct. 1969, pp. 772–774.

Primary Examiner—Ernest F. Karlsen
Assistant Examiner—Kevin D. O'Shea
Attorney, Agent, or Firm—H. D. Messner; Edward J. Keeling

[57] ABSTRACT

In accordance with the present invention, fluid-flow properties of a rock sample based on NMR response of the hydrogen nuclei of interstitial fluids within the pore space of such sample, can be swiftly and accurately achieved using a computer-controlled, portable NMR instrument. Inherent instrument inadequacy of a DC field inhomogeneity is controllably augmented by a depolarizing code (provided via a computer-controller controlling a transmitter-pulser) to ensure complete magnetic memory erasing prior to a new measuring cycle. Result: Even though the instrument is placed at field sites away from the usual processing center, quick analysis of rock samples as during the drilling of a well, results.

11 Claims, 5 Drawing Figures

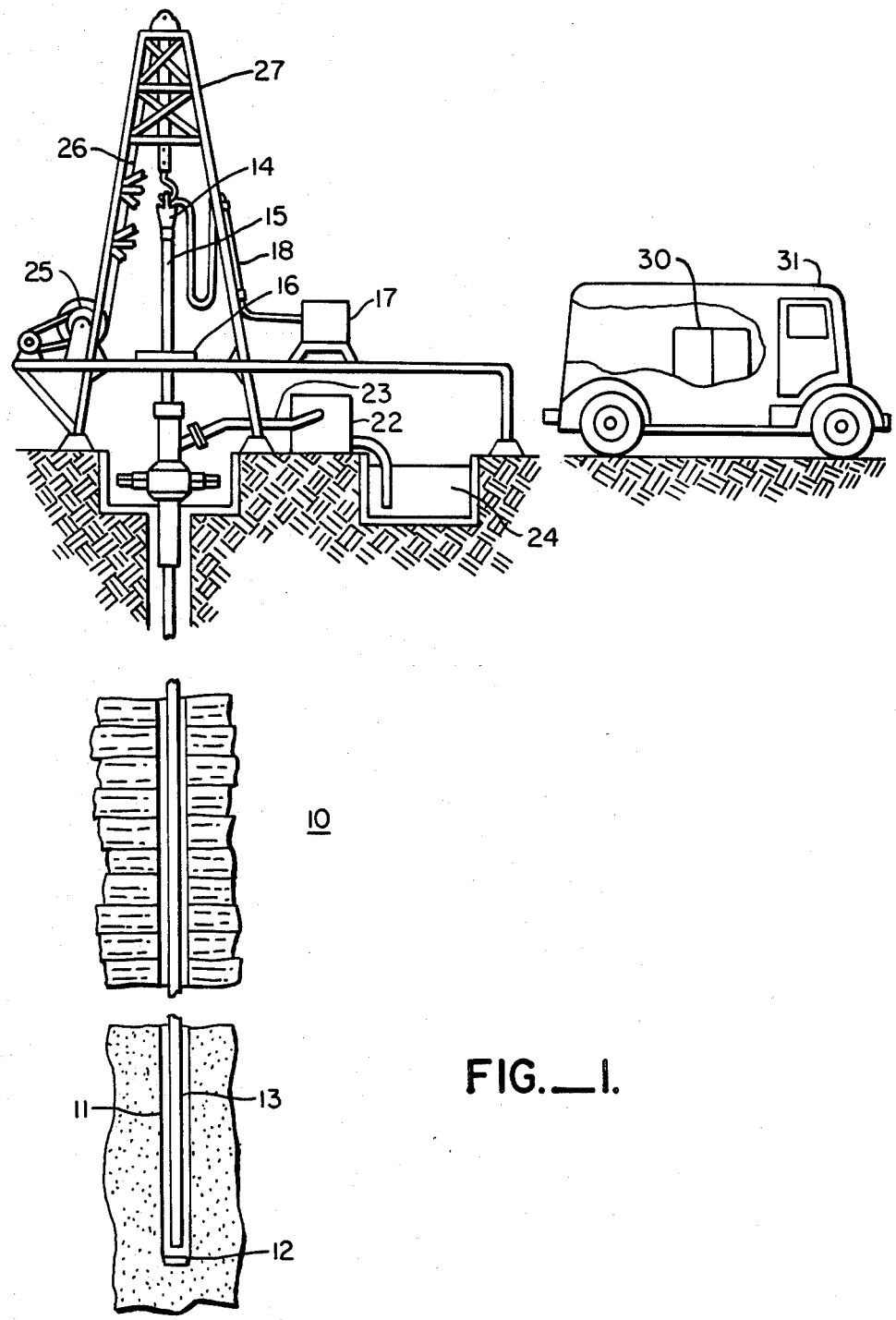
FIG._1.

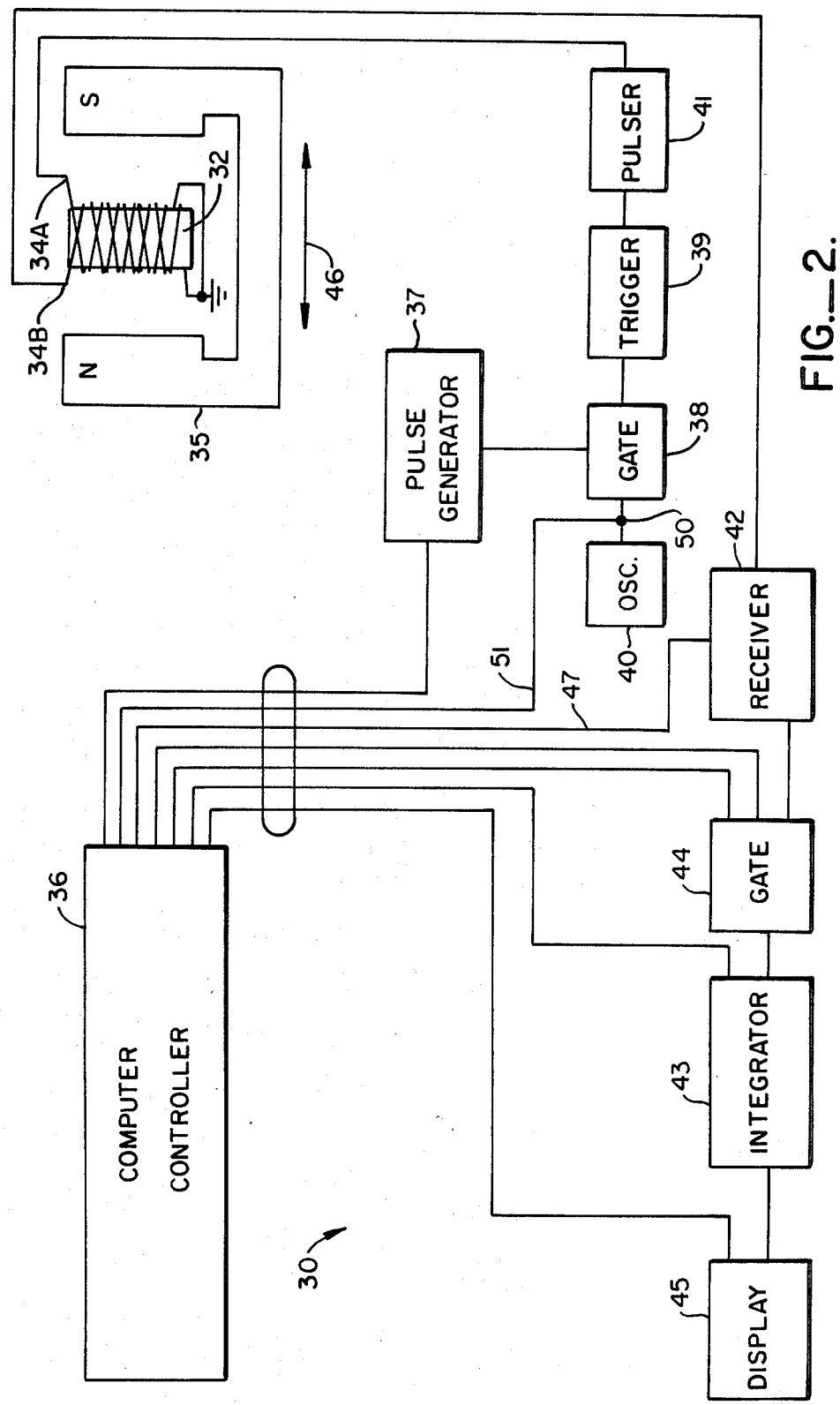
FIG._2.

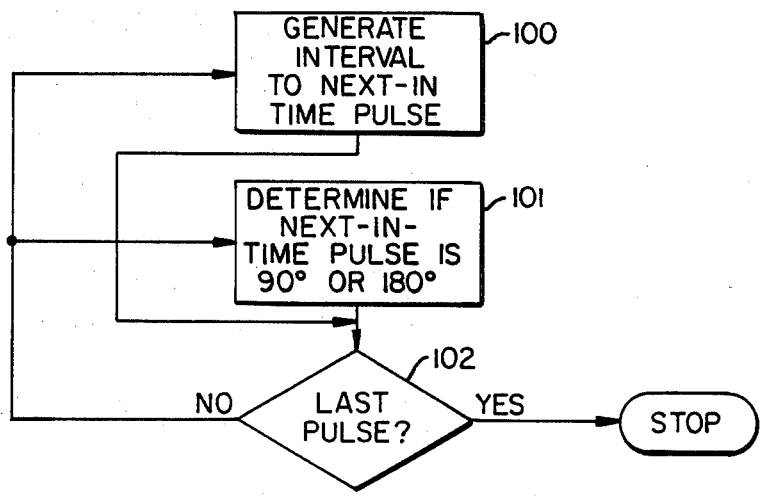
FIG._3.
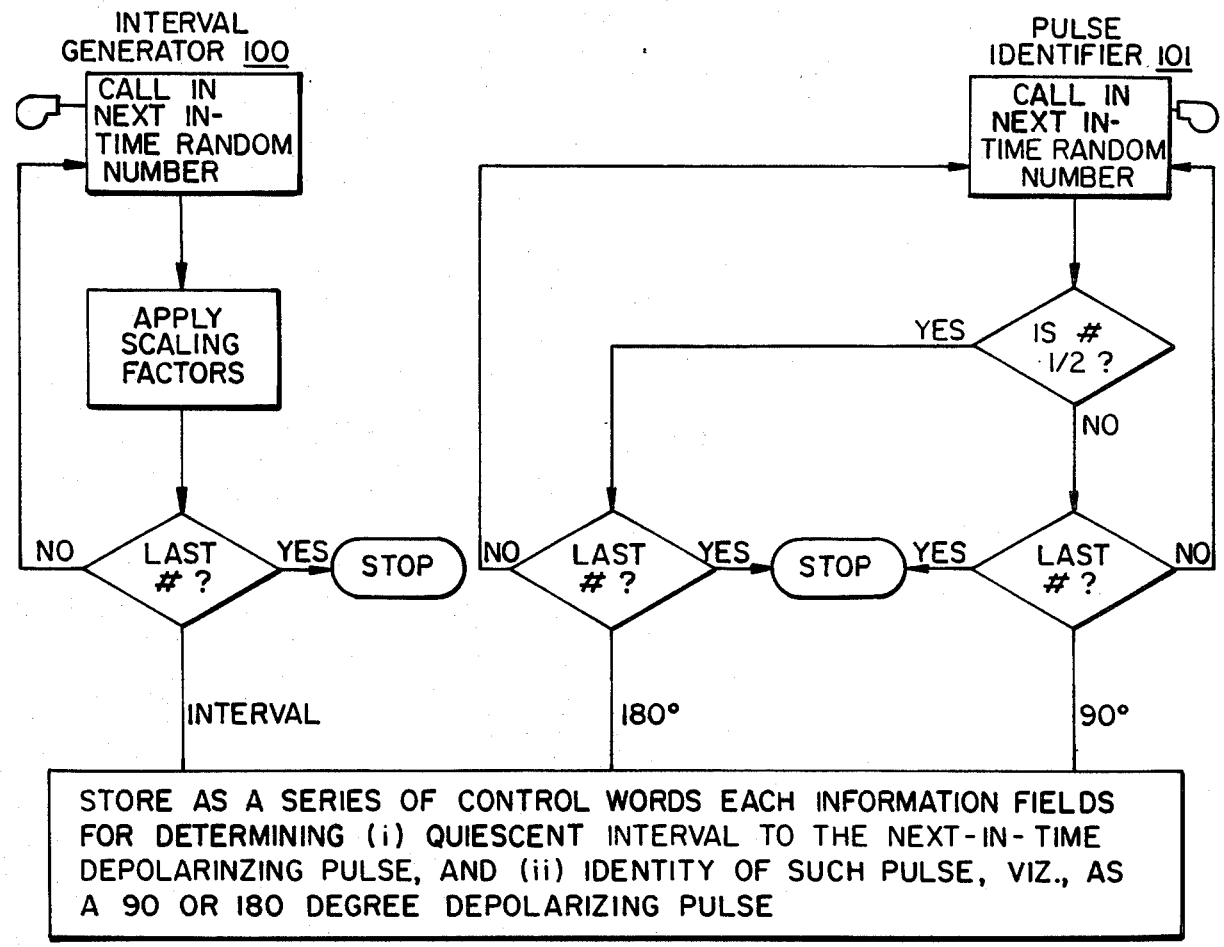
FIG._4.

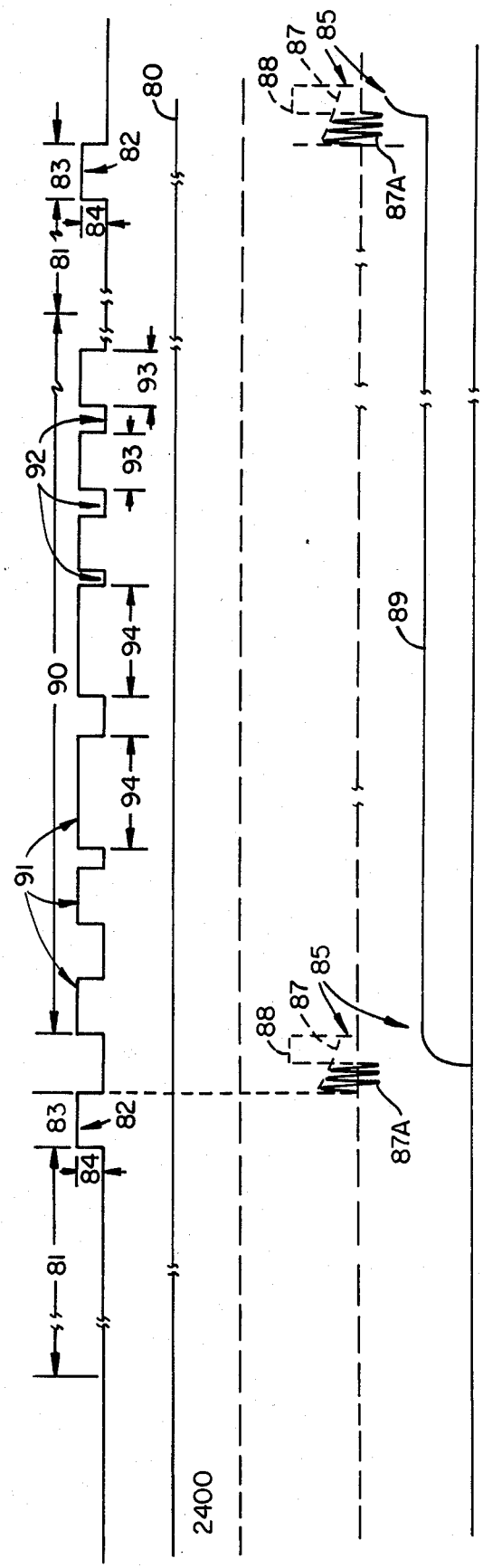
FIG._5.

COMPUTER-CONTROLLED, PORTABLE PULSED NMR INSTRUMENT AND METHOD OF USE WHEREIN DEPOLARIZATION IS ULTRASHORTENED USING PSEUDO RANDOMLY SPACED AND ORIENTED RF DEPOLARIZATION PULSES

CROSS-REFERENCES TO RELATED APPLICATIONS

My following applications are hereby incorporated herein by reference:

| Ser. No. | | Filed | Title |
| --- | --- | --- | --- |
| 255,978 | Abandoned | 4/15/81 | FOR "PORTABLE PULSED NMR INSTRUMENT AND METHOD OF USE" |
| 255,977 | U.S. Pat. No. 4,412,179 | 4/15/81 | FOR "COMPUTER-CONTROLLED, PORTABLE PULSED NMR INSTRUMENT AND METHOD OF USE WHEREIN THE TIMES OF RF INTERROGATION ARE DISTRIBUTED OVER AT LEAST A CYCLE AT THE NUCLEAR MAGNETIZATION PRECESSIONAL FREQUENCY" |
| 255,975 | U.S. Pat. No. 4,412,178 | 4/15/81 | FOR "COMPUTER-CONTROLLED, PORTABLE PULSED NMR INSTRUMENT AND METHOD OF USE WHEREIN A DC MAGNETIC FIELD GRADIENT IS ARTIFICIALLY INTRODUCED" |
| 255,976 | U.S. Pat. No. 4,408,161 | 4/15/81 | FOR "COMPUTER-CONTROLLED, PORTABLE SPIN ECHO NMR INSTRUMENT AND METHOD OF USE" |
| 255,979 | U.S. Pat. No. 4,389,613 | 4/15/81 | FOR "COMPUTER-CONTROLLED, PORTABLE PULSED NMR INSTRUMENT AND METHOD OF USE" |

SCOPE OF THE INVENTION

This invention relates to a method and apparatus for determining physical properties of porous media and more particularly to indication of fluid-flow properties of ultrasmall samples of such media by a computer-controlled, small, portable NMR instrument. In accordance with the present invention, an inherent inadequacy of the instrument, viz., DC field inhomogeneity is controllably augmented by a randomly generated RF depolarization code that shortens the depolarization cycle to a minimum. In this aspect, the present invention maintains flow-through efficiency, i.e., the number of responses provided per unit time, at a surprisingly high level. Result: Flow properties of samples including porosity, permeability and recoverable fluid content, can be quickly estimated in remote field sites irrespective of instrument idiosyncrasies.

BACKGROUND OF THE INVENTION

In a number of my prior applications, op. cit., I describe using a portable NMR instrument so that flow properties of rock samples can be accurately and swiftly measured, especially at remote field locations. The described principle of operation: spin-lattice relaxation times of fluids in chip samples, can be accurately correlated with flow properties of different rock samples.

In a lesser number of my prior applications, op. cit., I describe difficulties of NMR instruments that did not have characteristics of which I based my prior advances: large DC field inhomogeneity and unusual background phase incoherence. I found in a number of applications that at least one of the above-mentioned conditions had been eliminated.

To take into account such instrument variation, in my co-pending application, Ser. No. 255,977, filed Apr. 15, 1981, U.S. Pat. No. 4,412,179, op. cit., I reinserted phasal incoherence into the system. Method of insertion: a gating code was created by a computer-controller for controlling a transmitter-pulser such that RF interrogation is limited in distribution to at least a cycle at the nuclear magnetization precessional frequency. While the above gating code was useful in many circumstances, it is still desirable to have a system that has the capability of more flexible operations, viz., to be useful in field situations irrespective of whether (or not) phasal incoherence is (or is not) inherently present in the field system, yet continue to provide the improved flow-through efficiency of my previous embodiments.

SUMMARY OF THE INVENTION

In accordance with the present invention, fluid-flow properties of rock samples based on NMR response of the hydrogen nuclei of interstitial fluids within the pore space of such samples, can be swiftly and accurately achieved using a computer-controlled, portable NMR instrument. In the invention, a pseudo randomly generated RF depolarization code augments DC field inhomogeneity. Result: the depolarization cycle is shortened to a minimum. In this aspect, the present invention maintains flow-through efficiency, i.e., number of responses provided per unit time, at a surprisingly high level. Thus, flow properties of samples including porosity, permeability and recoverable fluid content, can be quickly estimated irrespective of instrument/operator location, and instrument idiosyncrasies.

Also of importance in the code creation by the present invention, is the fact that the spacing between the RF depolarizations pulses as well as the orientation of the particular next-in-time depolarizing pulse, viz., a 90 or a 180 degree pulse, are pseudo randomly determined. While there is a need for the sample to go through a depolarization cycle to attain a reproducible initial state (i.e., a zero polarization), such cycle is remarkably short, say in a range of 14–25 milliseconds. Result: prior magnetic memories associated with the NMR responses (especially of shorter polarizing periods) are quickly erased so that a new measuring cycle can begin quickly.

DETAILED DESCRIPTION OF THE DRAWINGS

FIG. 1 illustrates a well drilling environment in which a computer-controlled pulsed NMR instrument and method of the present invention has use.

FIG. 2 illustrates in bllock form the apparatus of FIG. 1 including a computer-controller for generating at least two sets of codes—an interrogation code and a depolarization code—for testing of ultrasmall samples of a porous earth formation in accordance with the present invention.

FIGS. 3 and 4 are flow diagrams illustrating the manner in which the computer-controller of FIG. 2 generates the depolarization code in accordance with the present invention.

FIG. 5 is a timing diagram illustrating in particular the sequence of using a depolarization code followed by an interrogation code in accordance with the method of the present invention.

DESCRIPTIONS OF PREFERRED EMBODIMENTS

While the environment of particular use of the present invention, viz., in an on-site drilling of an earth formation has been previously described in my prior applications, op. cit., a brief review is believed to be in order and is present below with reference to FIG. 1.

In FIG. 1, earth formation 10 is seen to be penetrated by well bore 11 under drilling conditions. That is to say, drill bit 12 of drill string 13 is being rotated via swivel 14, Kelly bar 15 and rotary drill table 16. Result: Drill chips accumulate at the bottom of the wellbore 11.

In order to bring the rock chips up from the bottom of the wellbore 11 (as well as to cool bit 12) the conventional drilling technology employs a drilling fluid. The fluid continuously circulates in the wellbore 11 after its continuous introduction uphole at the surface of the formation 10.

The drilling fluid is formed at a mixer 17. When properly mixed, the fluid passes via line 18, swivel 14, and Kelly bar 15 and thence down drill string 13. After exiting from the drill string 13, the fluid cools the drill bit 12 as well as picks up rock chips at the bottom of the wellbore 11. After traveling up the annulus 20 (between the sidewall 21 of the wellbore 11 and the drill string 13), the fluid exits uphole via line 23 to a Blooie box 22. After various levels of separation have occurred in the box 22, the fluid comes to rest at sump 24. Rock chips previously entrained in the fluid are quickly gathered, and after brief preparation, as explained below, are analyzed at the well site by a pulsed NMR instrument 30 located within truck 31. The purpose of such analysis: to determne the fluid-producing potential of the earth formation 10 as a function of depth, in a quick and accurate manner. Of importance in this regard is the fact that annotation of the rock samples with drilling depth can be gathered from shieve 25 attached to swivel 14 via cable 26 and support bar 27.

It should be apparent that quick evaluation of the fluid-producing potential of the earth formation 10 is exceedingly helpful to the field operator. For example, the operator is interested in quickly determining the following: if the rock samples have the necessary porosity associated with quantities of petroleum: if they have the necessary permeability to permit the fluid contents to flow towards possible producing wells; and whether or not the rock samples contained (in-situ) fluids of interest.

Then decisions can be made at the well site about, e.g., when to change from straght drilling to coring, when to run logs and when to make formation tests without the necessity of using conventional time-consuming methods and techniques. Recall in this regard that prior art NMR instruments described in my copending application Ser. No. 255,979, Pat. No. 4,389,613 for "COMPUTER-CONTROLLED, PORTABLE PULSED NMR INSTRUMENT AND METHOD OF USE", included a step for allowing the nuclei of the interstitial fluids to return to equilibrium in laboratory environments each time a response was sought. A 180 degree RF pulse applied to the sample was followed by a 90 degree RF pulse. But total depolarization time per NMR response was long, about 6 seconds. So in addition to the fact that field samples had to be taken to off-site centers for NMR evaluations, that evaluation itself was elongated in time due to long depolarization periods required by the associated NMR instruments.

Attention is now directed to FIG. 2 in which computer-controlled pulsed NMR instrument 30 of the present invention is shown in more detail.

NMR instrument 30 incorporates many usual elements, e.g., a sample holder 32 into which the rock chips are placed. Mechanically, the holder 32 is surrounded by co-extensive and colinear coils 34A and 34B at right angles to a DC field of magnet 35.

Timed operations are determined by computer-controller 36. The computer-controller 36 generates, inter alia, at least three series of digital control codes (signals) in bit form which, via trigger circuit 39, control oscillator 40 and hence the triggering of pulser 41—an interrogation code, a depolarization code, and a detection code.

By the first-mentioned code, pulser 41 in effect "interrogates" the sample through a series of magnetic pulses oscillating at the Larmor frequency for hydrogen nuclei in the DC field of magnet 35. Result: A series of NMR responses associated with a succession of nuclear magnetization build-ups in the DC field of magnet 35, can be indicated via receiver 42 and its associated circuitry: integrator 43, in circuit with display 45 via gate 44.

At integrator 43, each nuclear magnetization signal is monitored and stored (via capacitor charging circuits) under direction of other pulse codes provided by computer-controller 36, say, at gate 44. The NMR signals are ultimately displayed at display 45. These signals first undergo normalization. Hence, they represent only magnetization build-up within an average time interval (not the total time for all polarizing intervals), between interrogation pulses.

Operations of the computer-controller 36 are, of course, also communicated to receiver 42 and integrator 43 to key their operations as well as that of display 45, as indicated below, via additional pulse codes.

Of primary concern in the control of pulser 41 is to assure that the starting angular position of nuclear magnetization, triggered by the interrogation pulses, is random with time. In this regard, the present invention uses a pseudo randomly generated polarization code for controlling via pulse generator 37 and gate network 38 the RF coils 34A and 34B to assure such an equilibrium state but in minimum time.

Also of importance in the code creation by the present invention, is the fact that the spacing between the RF depolarizations pulses, i.e., quiescent time interval, as well as the particular orientation of next-in-time depolarizing pulse, viz., a 90 or a 180 degree pulse, are pseudo randomly determined. Thus, while there is a need for the sample to go through a depolarization cycle to attain a reproducible initial state (i.e., a zero polarization state), such cycle in the present invention, is remarkably short, say in a range of 14–25 milliseconds. Result: echoes of prior generated NMR responses especially those associated with shorter polarizing periods, are quickly erased.

But before the depolarization code of the invention is examined in detail, a review of the key NMR terminology may be beneficial. Such description can be found at correlatable pages of my related application for "COMPUTER-CONTROLLED, PORTABLE PULSED NMR INSTRUMENT AND METHOD OF USE", Pat. No. 4,389,613, op. cit., which is hereby incorporated herein by reference to that application. Since such incorporation cannot occur until the former has been allowed, such material is provisionally set out below between brackets.

NUCLEAR MAGNETIZATION, DIPOLE MOMENTS POLARIZATION AND RELAXATION

Hydrogen nuclei of entrained fluids of the rock samples within the holder 32 have magnetic dipole moments which produce magnetic fields somewhat like those of tiny magnets. Were it not for the fact that the moments are within the influence of the DC field of magnet 35, their fields would be randomly oriented and not produce an observable external magnetic field. But since they are subjected to such DC field, their associated magnetic fields become aligned with the DC field, say in direction of arrow 46. At the same time, a scrambling effect due to thermal motion is produced. It tends to prevent such alignment. Result: A slightly preferential alignment in the direction of the arrow 46 (called the "polarization") occurs. Note that the polarization is proportional to the strength of the DC field of magnet 35 that causes the alignment but inversely proportional to absolute temperature, the latter being a measure of thermal motion tended to scramble the system of nuclear magnetic moments.

The nuclear magnetization corresponds to the polarization, and produces a magnetic field which can be detected. Note that the nuclear magnetization does not immediately occur when the DC field is applied nor does it decay immediately when the DC field is removed or vice versa as when the holder 32 (with samples therein) is placed in or removed from the steady-state DC field of magnet 35. The process of the approach of the nuclear magnetization to its new equilibrium value when the magnetic field is changed is called "relaxation" and the corresponding times are called "relaxation times."

PRECESSION

In addition to being little magnets, fluid nuclei within the holder 32, are also like little gyroscopes, and the applied DC magnetic field of the magnet 35 will twist them just as gravity twists a spinning top. Result: The nuclei precess. That is, they precess unless they are aligned with the DC magnetic field just as the toy top precesses so long as it is not aligned with the earth's field of gravity.

DETECTION OF PRECESSION

A precessing nuclear magnetization produces a rotating magnetic field which in turn generates electric signals which can be detected. Precessional frequencies are directly proportional to the strength of the twist causing the precession, that is to say, it is directly proportional to the strength of applied DC magnetic field of the magnet 35, and the precessional frequency is 4.2577 kilohertz per gauss of applied DC field for hydrogen nuclei of interest.

CONDITIONS FOR PRECESSION

Two things must be present to obtain a precessing nuclear magnetization: First, the magnetization must be produced, by the placement of holder 32 (with sample) in the DC magnetic field provided by magnet 35 for an appropriate length of time. Second, the magnetization and magnetic DC field must somehow be made not parallel to each other as by (i) manipulating the magnetic fields to reorient the nuclear magnetization, or (ii) reorienting the magnetic fields so that the magnetization is subjected to a magnetic field in a new direction.

In nuclear magnetism logging, the concept set forth in item (ii) is used, i.e., proton precession is caused to take place in the earth's field after the nuclear magnetization has been gathered in a direction in the borehole perpendicular to the earth's field; when the polarizing field is cut off, the magnetization is left to precess about the earth's field.

In pulsed NMR technology, the opposite is done. The magnetization is first generated by means of the permanent magnet 35 in the direction of arrow 46 and then it is reoriented by means of briefly applied radio-frequency magnetic fields at right angles to the DC field via coil 34A, and then it is allowed to precess about the DC field.

CONDITIONS FOR RF REORIENTATION OF THE MAGNETIZATION

A convenient way to visualize reorientation of the nuclear magnetization associated with the hydrogen nuclei within the holder 32 is via the analogous use of a rotating frame of reference.

It can be shown mathematically and is plausible intuitively that assuming a reference frame rotating with the same frequency as that of the RF magnetic field applied via coil 34A to cause precession, then in the rotating frame the reorientation of the nuclear magnetization occurs as if certain magnetic fields were cancelled. If additional fields are present (other than those apparently cancelled), then is may be easy to visualize their effect.

As a simple example, assume that a reference frame rotates at exactly the precessional frequency of the nuclear magnetization in the DC field of the permanent magnet 35. Then in the rotating frame the magnetization is apparently not subject to the action of any magnetic field at all. As the oscillating RF field (via coil 34A) is applied exactly at the precessional frequency of the hydrogen nuclei (again, being exactly the frequency with which the reference frame rotates), the oscillating RF field, in effect, consists of two rotating fields. Each has half the amplitude of the oscillating field and rotates in opposite directions. Result: Their components perpendicular to the oscillating field cancel, while their components parallel to the oscillating field add so that each equal to half the oscillating field. One of these rotating fields appears to stand still, that is, the one that is rotating the same way as is the reference frame, and causea a steady precession of the nuclear magnetization about it. But, the one rotating the other way now appears to rotate twice as fast, and alternates directions so rapidly that it has no effect.

QUANTITATIVE EXAMPLE

Consider that 20 gauss is the strength of the RF field applied via the coil 34A at right angles to the DC field of magnet 35. Thus, the strength of a rotating component is 10 gauss. Consider also that the DC field of the magnet 35 (about 2400 gauss) is absent in the rotating frame of reference leaving what appears to be a static field of 10 gauss (plus another 10 gauss field rotating so fast it is ineffectual), acting in the direction of arrow 46. The nuclear magnetization precesses about the 10 gauss field. (turns about this field as an axis) at a frequency of 42577 hertz (10 gauss×4257.7 hertz per gauss) corresponding to a period of 23.5 microseconds.

If the RF field is applied for 23.5 microseconds, the magnetization would have precessed one full cycle, and would be oriented just as it was before application of the RF field by the coil 34A. However, suppose the RF pulse of the coil 34A is supplied just under 6 microseconds. Then, the magnetization initially parallel to the DC field, precesses about a quarter cycle (90° in the rotating frame end), leaving the magnetization at right angles to the strong DC field. Since it is at right angles when the RF pulse terminates, conditions necessary for magnetization precession exists. Result: An NMR response is established. Such responses can be averaged over a series of polarizing times, provided there is rapid coordination of operations including creation of a proper depolarization code at computer-controller 36 each polarizing cycle.

FIGS. 3 and 4 depict details of the depolarization code created for use within computer-controller 36.

In FIG. 3, note the parallel generation of two aspects of such code: (i) at 100 where the magnitude of the next-in-time quiescent time interval is determined, such value to be assigned to the time interval occurring before the next-in-time depolarizing pulse; and (ii) at 101 where the identity of such next-in-time depolarizing pulse is set forth. Both processes are seen to terminate when the decisional step 102 is answered affirmatively.

FIG. 4 details the processes 100 and 101 in more detail.

As shown, quiescent interval generation at 100 requires first the inputting, in sequence, of a series of pseudo random numbers on tape 103 previously created, to a call-in window at 104. Next, the specific called-in random number is scaled at 105 and after passing through decisional step 106, the up scaled value is stored as part of the depolarization code at 108.

Its address is provided on the basis of the next-in-time pulse.

Similarly, pulse triggering generation at 101 requires in the inputting of a similar series of pseudo random numbers via tape 110 to a second call-in window at 111 using a similar addressing scheme. Next, the specific called-in number is evaluated at decisional step 112 as either a 180 degree pulse (seen in the FIG. 4 as passing to storage 108 via loop 113) or as a 90 degree pulse passing to the same storage 108 as did the prior 90 degree pulse, but via loop 114. That is to say, if the random number that has been selected randomly by the computer-controller is in, say a range of 0.5000000000 to 1.0000000000, that particular number is diverted via loop 113 via decisional step 115 to storage 108 with appropriate address flag indicating the pulse is a 180 degree control pulse. In a similar manner, if the called-in random number is in a range of 0000000 to 0.499999999999, that number is diverted via loop 116 through decisional 118 to storage 108 and appropriately flagged as a 90 degree trigger pulse. Note that the information related to next-in-time (i) values of quiescent time intervals and (ii) pulse identity, viz., 90 to 180 degree pulses, form a single depolarizing code comprising a series of control words each of which defining at least two fields that flag (i) next-in-time values of the series of quiescent time intervals that make the depolarization cycle, and (ii) next-in-time pulse identity for the same cycle. After generation in accordance with FIGS. 3 and 4, the control code is placed in storage with the computer-controller 36. But since each of the above items, viz., items (i) and (ii) supra, begin with the use of random numbers a brief review is in order and is set forth below.

Generating the pseudo-random numbering tables of tapes 103 and 110 is conventional. Within the art, extensive use has already been made of control codes embodied on magnetic tape, so it is unnecessary to discuss where the codes are generated. That is, the art has now progressed to the point that such codes no longer must be generated at a remote computer center and transported on magnetic tape to a field location. Codes can now be generated "in real time" at field sites using microprocessors, and it seems possible that in the future this will become the preferred way to generate them.

One way is to use the well-known subroutines in the IBM Scientific Subroutine Package: RANDU, to generate a set of uniformly-random numbers. Other ways of generating suitable sets of numbers have been discussed by Lewis in the IBM Systems Journal No. 2 (1969) and by Knuth in his book "Seminumerical Algorithms" (Vol. 2 of the "Art of Computer Programming", Addison Wesley Pub. Co.). However it is done, the desired objective is simply the preparation of two sets of pseudo random numbers for use with the control code of the present invention.

The discussion here will concern itself with some of the possible options in preparing a control code particularly suited for the practice of this invention.

To begin, consider the length of time that each depolarization cycle is operative: viz., about 15-25 milliseconds; also, assume that the pulse length of the RF pulses is fixed, say 4.5. microseconds for a 90° pulse and about 9.0 microseconds for a 180° pulse. Hence for say 20 milliseconds the code will require between 40-60 control words. These may be generated in several ways conventional in the art.

FIG. 5 illustrated operations of the present invention by comparing—on a time basis—the relationship of the interrogation, depolarizing and detection codes generated by computer-controller 36 and the effect of such signals at associated circuitry.

It should be first recalled from FIG. 2 that the computer-controller 36 generates as least three sets of pulse codes (in bit form).

In general, at least one set is associated with the generation of the interrogating RF pulses 82 as previously mentioned. Such code supervises signal characteristics such as pulse width 83 and pulse amplitude 84 and gate enabling rate via generator 37 and network 38.

Another set, as previously mentioned, relates to the detection of the resulting NMR signals. Of particular importance in this regard is the control exercised over time windows 88 of FIG. 5. Key to operation: The fact that such code can be easily used to divide the time domain associated with each window 88 into a plurality of sub-intervals; hence, it is a simple matter to have each window 88 open a selected number of sub-intervals after cessation of each interrogation pulse 82 as well as close, on command, after a second number of intervals has passed.

Yet another set of code relates to the depolarizing code associated with the present invention. The last-mentioned code results in the generation over depolarizing period 90 of FIG. 5, a series of pseudo random rapid depolarization pulses 91 situated and chosen in the manner of FIGS. 3 and 4. Result: the hydrogen nuclei of the fluids within the sample are randomly oriented with time in a surprisingly short period of time. That is to say, the starting angular positions of the nuclear magnetization of the nuclei as triggered by the interrogation pulses 82 is random with time before another interval 81 starts.

Of particular importance is the fact that integrity of depolarization is maintained irrespective of the pseudo random nature of the quiescent intervals 92 occurring between the orientation of the depolarizing pulses 91. In this regard, note that the 90° RF pulse width 93 of the depolarization pulses 91 is essentially constant from like pulse-to-like pulse over the depolarization cycle, about equal to 4.5 microseconds but is about one-half that of the 180° RF pulse width 94. Their amplitudes are essentially the same, however. Hence, the depolarizing code of the present invention must not only take into account the time span available, i.e., the depolarizing period 90, the quiescent intervals 92 but also the orientation of the depolarizing pulses 91, viz., a 90° or 180° pulse. This occurs, of course, in time synchronization with the polarization and precessional operations of the system.

That is to say, from a control standpoint, all control codes interact to maintain the integrity of each selected polarizing, detecting and depolarizing period during each measuring cycle. In that way, operations can proceed orderly from level-to-level without interruption.

For example, assume four series of polarizing periods (each series akin to the polarizing period 81, FIG. 5) are to be used and say these polarizing periods are 10, 20, 30 and 40 milliseconds, respectfully, and that the depolarization periods 90 will have a constant value, say equal to 25 milliseconds per each measuring cycle. Since in each case the RF magnetic pulses widths 83, 93 and 94 the maximum quiescent intervals 92, are known, the periods of the polarizing versus depolarizing cycle are likewise pre-determinable, namely, for the aforementioned 10, 20, 30 or 40 milliseconds the polarizing periods of each known, as are the three depolarizing periods, i.e., equal to 25 intervening milliseconds following each polarizing period.

Assume also that each polarizing period 81 and each depolarizing period 90 is to be repeated 20 times. That is to say, each NMR response 85 associated with a respective 10, 20, 30 or 40 millisecond polarizing period, is to be repeated 20 times before the next operational level occurs. Thus, the computer-controller 36 would essentially track three variables: (1) time increments within the preset polarizing periods of 10, 20, 30 or 40 milliseconds, and (2) the iterative number of polarizing periods within the maximum allowed 20 NMR periods needed per measuring cycle, and (3) the intervening number of depolarizing periods. Result: As the number of magnetization build-ups (due to the DC magnetization field 80 of magnet 35 acting on the hydrogen nuclei) and depolarizing periods 90 are counted, the associated NMR responses 85 can be recorded in a highly accurate manner. In the present invention, a control counter (of the computer-controller 36) is associated with a supervising register similarly located; together they can be utilized on a MATCH count basis to supervise operations. For example, in any polarizing (or depolarizing) period when the count of the counter matches that in storage, the supervising register decrements its pre-existing count by ONE and then resets the control counter to zero so that the latter can begin anew.

That is to say, to provide iterative detection and recording of the NMR signal as explained below, the computer-controller 36 makes use of the MATCH basis of scorekeeping in the control counters and registers to allow the process to be repeated and then to be rerepeated until the decremented count at a particular supervising register reaches a zero count value. At that occurrence (say, at the occurrence of the 20-in-20th measuring increment), a new supervising register count can be triggered to initiate operations of the next level of the operations whereby a new series of NMR responses associated with a different magnetization period (but having the same depolarizing period) can be rapidly provided. The process continues until the lowest level of the cycle is reached at which time operations terminate.

Since the receiver 42 preferably includes diode rectification subcircuitry, its signal receiver output 85 is only an envelope 87 of the positive peaks of the precessional signals 87A, not their absolute values. That is to say, responses 75 of FIG. 3 are first seen as signals 87 (associated with receiver 42) and next seen as signals 89 (associated with integrator 43).

Signals 89, of course, result from positive rectification of the decaying precessional signals 87 over the time window 88 and can represent feedback operations of an operational amplifier incrementally charging a capacitor to a peak amount proportional to be integrated rectified voltage produced during signal gates at the receiver 42. Only after the repetitive measuring cycle has been completed, say 20 repetitions, does the capacitor become discharged. Its ultimate value (as well as intermediate values) are indicated at display 45 as a cumulative display.

I.e., to say, the display at display 45 is normalized by dividing the total display count by the number of measuring repetitions, and the ultimate value is held for display as long as required, usually until a reset signal (see FIG. 2) is received from the computer-controller 36 to initiate a new cycle. During that period, a hard-copy printer or a tape recorder (not shown) can record the display. Note in this regard that since coils 34A and 34B are co-extensive, they also are, unfortunately, interactive. I.e., when coil 34A radiates RF pulses 82 and 91, such pulses are also detected at coil 34B (and receiver 42). Hence, a need exists to disable the receiver 42 for selected sub-intervals of time via line 47 connected to the computer-controller 36 which cooperatively function to "blank off" the receiver 42 as the transmitter-pulser 41 is activated.

Further refinements in the timing of operations can also be provided by the computer-controller 36 at, say gate 44 which provides a synchronizing function. Result: generation of a particular and repetitive time windows 88 over which the amplitude magnetization per unit time can be measured. Although the time frame of the windows 88 is constant within the measuring cycle, it can be lengthened (time-shifted) as desired, e.g., the computer-controller 36 can accurately control both the delay times and polarizing and depolarizing intervals so that each series of the time windows open a preselected time increment after the transmitter-pulser 41 has been activated, as well as closes at the appropriate time, say as measured from zero-crossing of the same pulser output. Result: The magnetization build-up over the time windows 88 can be properly gated to an integrator 43 where amplitude accumulation over the repeated measuring cycle occurs, viz., so that the amplitude per window increment is accummulated at the integrator 43 for the entire 20 NMR measuring periods. Then as dictated by a change in operational level within the computer-controller 36, the integrator 43 is reset to zero, and a new measuring cycle begins.

In order to further understand the complexity of providing a series of polarizing and depolarizing periods note that both the DC magnetic field 80 and the RF fields are inhomogeneous in space. That is, not all of the fluid nuclei within the sample experience the same DC field or the same RF field. So even if the RF frequency is correctly tuned so that the DC field is exactly cancelled for one point in the sample volume, there will be other nuclei in the sample where the DC field is under-cancelled or overcancelled. But since each quiescent interval 92 that precedes the next-in-time depolarizing pulse 91 as well as the 90° or 180° orientation of such next-in-time pulse are generated in pseudo random fashion, the adjacent parts of the nuclei (that were previously under- or over-cancelled) themselves undergo cancellation. Also if the volume in the sample is large compared to the DC field variation, the sample volume will experience different DC fields from part-to-part within the volume, resulting in under- or over-cancelled DC field components in the rotating frame of reference with an associated variation in the rate of precession. But such effects do not exist (or are at least minimized) in the matter of the present invention because:

(1) the dimension of holder 32 of the present invention is very small ($\pi \times$ the diameter $\times$ the length of the sample) compared to inhomogeneity gradient D of the DC field.

(2) the RF field pulse amplitudes of the interrogation and depolarizing pulses are larger in magnitude compared to the over- and under-cancelled field components discussed above. That is, the amplitude of the RF pulses 82 and 91 are maintained at values that is substantially greater than the variation D in the DC field over the sample volume.

(3) After depolarization, any effects of DC inhomogeneity that linger on, are offset by the fact that they themselves aid in elimination of any residual "echoes". This is because the slight inhomogeneity of the DC field causes the nuclei to experience slightly different DC fields (from part-to-part within the sample volume). Ultimately, each such part rotates at a slightly different rate of precession.

For shorter polarizing periods, if the system operating parameters are such as to generate—inherently—incoherent phase jitter as set forth in detail in my prior applications op. cit., then differences in rates of precession from part-to-part within the sample volume, are further aided in reaching equilibrium. When such condition is not inherently provided, however, then use of pseudo randomly generated depolarizing pulses in accordance with the present invention, results in random reorientation of the magnetic movements of the nuclei of the sample. That is, the start position of the angular phase of the perpendicular component of magnetization is changed in a random manner due to the pseudo random nature of and the spacing between the depolarization pulses 91 over the course of the depolarizing period 90.

SAMPLE PREPARATION

Rock samples obtained in the manner depicted in FIG. 1 or mechanically extracted from a core cut from the earth during drilling, are cleansed as discussed below.

If the samples have no visible oil traces in their outer surfaces, simple immersion in a 1% NaCl aqueous solution is usually sufficient. Removal of air (from within their pores) may be helpful, as done by an air evacuation system. Cleansed samples (after pat drying) are inserted to a depth of about 6 mm within coil 34A. Sample volume is a little over 0.3 cubic cm. Howeve, since the chips are irregular in shape, they may occupy only about half the space.

If the samples have some oil at their outer surfaces (a common occurrence if they come from a formation penetrated by a well whose circulating fluid was an oil-base drilling mud or if the sample is from an oil-containing zone), cleaning can be a bit more difficult. But applying conventional dry cleaning fluids to the oil "stains" seems to solve the problem. Then saline immersion, followed by air evacuation and pat drying, provide adequately cleansed samples for testing in accordance with the present invention.

CONCLUSION

In accordance with the present invention, a series of NMR measurements provides indications of flow properties of the associated rock samples in those instances where pseudo random depolarizing pulses must be used. Although analysis is not simple (because if the porous rock contains water, the rock acts as a "catalyst", speeding up both the magnetization build-up and relaxation reactions), the present invention provides surprisingly accurate results under such circumstances.

One skilled in the art should realize that as little as two separate NMR responses can define a relaxation curve for the hydrogen nuclei undergoing examination. More sophisticated techniques are available, see for example, my applications previously cited, especially for use in remote oilfield settings.

All specific embodiments of the invention have been described in detail, and it should be understood that the invention is not limited thereto as many variations will be readily apparent to those skilled in the art. Thus, the invention is to be given the broadest possible interpretation within the terms of the following claims.

What is claimed is:

1. Automatic apparatus for swiftly determining fluid-flow properties of a rock sample based on NMR response of hydrogen nuclei of interstitial fluids within pore spaces of said sample in which pseudo random depolarizing pulses must be introduced to increase data-throughput efficiency (DTE) comprising:

(a) magnet means for producing a DC magnetic field acting on said rock sample, said magnetic field having an intensity of at least 1 kilogauss and an inhomogeneity of at least D gauss to aid in providing a series of nuclear magnetization build-ups associated with said interstitial fluids within said sample as a function of time;

(b) RF coil means acting at right angles to said DC magnetic field;

(c) transmitter means including digital control means for generating a first and a second control code associated with a series of RF magnetic pulses of selected frequency, amplitude and duration, connected to said RF coil means, said first control code controlling the production of said RF magnetic pulses for interrogating said sample, said second control code controlling the depolarizing of the said sample via a series of pseudo randomly spaced and oriented RF depolarizing pulses, said amplitude of each interrogating and depolarizing pulse being controlled to be at least greater than the variation D in said DC field over of said sample;

(d) receiver means connected to said digital control means and to said RF coil means for generating via a third control code associated with a plurality of time windows, output signals proportional to said nuclear magnetic resonance response of said interstitial fluids;

(e) said transmitter means including said digital control means providing via said depolarizing code an extremely short depolarizing period, so that said sample can be repetitively interrogated to serially indicate nuclear magnetization relaxation.

2. The apparatus of claim 1 in which the control means of said transmitter means includes storage means, said second depolarizing control code being stored at said storage means on a sequential basis as control words each having informational fields previously generated via pseudo random numbers for determining both (i) next-in-time quiescent interval values, and (ii) orientation of the next-in-time depolarizing pulse whereby the magnetic moments of said nuclei of said sample are depolarized within a surprisingly short depolarizing period.

3. Apparatus of claim 2 in which the depolarizing period is in a range of 15–25 milliseconds.

4. The apparatus of claim 1 wherein said receiver means is connected in series with an integrator circuit and wherein said third control code, normalize said NMR responses over a plurality of said time windows to attain first and second statistically-improved signals representing magnetization relaxations for different sets of time intervals between interrogation pulses.

5. The apparatus of claim 4 wherein said integrator circuit integrates said NMR responses in accordance with said third control code over each of said plurality of time windows to obtain at least an improved signal representing the normalized nuclear magnetization relaxation in said DC magnetic field between application of said RF magnetic interrogation pulses.

6. The apparatus of claim 1 wherein the inhomogeneity of the DC magnetic means aids in preventing refocusing of prior generated NMR signals during subsequent magnetization build-ups, especially at long polarizing periods.

7. A method for swiftly determining fluid-flow properties of a rock sample based on nuclear magnetic resonance (NMR) response of hydrogen nuclei of interstitial fluids within said sample in which pseudo random depolarizing pulses must be introduced in order to increase data-throughput efficiency (DTE) comprising:

(a) storing digital control codes associated with (i) a first and second series of RF magnetic pulses of selected frequency, duration and magnitude, and (ii) a plurality of time windows for detection of a plurality of NMR response signals;

(b) placing the rock sample in a steady DC magnetic field having a strength of at least 1 kilogauss and an inhomogeneity of at least D gauss to aid in providing a series of nuclear magnetization build-ups associated with said interstitial fluids;

(c) under control of said control codes, subjecting said sample to said first series of RF magnetic field pulses for interrogating said samples to cause reorientation of each of said series of built-up magnetizations and, after each magnetization build-up has occurred, subjecting said sample to said second series of pulses for depolarizing said sample, the magnitude of each of said series of pulses being greater than the variation D in strength in said DC field over said sample, said second series of pulses being both pseudo random in time and pseudo randomly oriented in space about said sample; and (d) automatically detecting after interrogation, but before depolarization, in accordance with said control codes, said plurality of nuclear magnetic resonance (NMR) signals indicative of nuclear magnetization relaxation, each of said NMR signals occurring between said secessive pulses of said first series of RF field pulses intermixed with a single depolarizing period.

8. A method for swiftly determining fluid-flow properties based on NMR response of hydrogen nuclei of interstitial fluid within rock samples, which properties may include porosity, permeability, recoverable fluid content, large-pore specific surface, argillaceous specific surface, or any combination or subcombination of these properties, in which pseudo random depolarizing pulses must be used in order to increase data-throughput efficiency (DTE), of a measuring system comprising:

(a) storing at least an interrogating, a depolarizing and a detection control code associated with (i) a first and second series of RF magnetic pulses, respectively, of selected frequency duration and magnitude, and (ii) a plurality of time windows for detection of a plurality of NMR response signals;

(b) placing the rock sample in a steady DC magnetic field having a strength of at least 1 kilogauss and an inhomogeneity of about D gauss to aid in providing a series of nuclear magnetizations build-ups associated with said interstitial fluid within said rock sample, said each nuclear magnetization having a preferential alignment parallel to said DC magnetic field;

(c) subjecting said sample on a sequential basis to said first series of RF magnetic pulses for interrogating said sample to cause reorientation of said magnetization to preferred alignments offset from said DC field, and after magnetization build-up has occurred, subjecting said sample to said second series of pulses for depolarizing said sample, said amplitude of said series of pulses being greater than the variation D in strength of said DC field over the sample, said second series of pulses being pseudo randomly spaced in time and pseudo randomly oriented in space about said sample;

(d) automatically detecting after interrogation, but before depolarization, in accordance with said detection code, NMR responses associated with precession of said magnetization build-ups about axes substantially parallel of said DC field magnetic field within said plurality of time windows, each of said windows occurring within an interval between two of said interrogation pulses and a single depolarizing period and within subintervals beginning at a fixed delayed time after cessation of each of said interrogation pulses; and (e) automatically repeating steps (c) through (d) whereby a different predetermined average repetition rate for said interrogation pulses is associated with a constant depolarizing period to obtain at least a second statistically-improved signal representing nuclear magnetization relaxation in said DC magnetic field within at least a different average time interval between said interrogation pulses, whereby flow properties of said sample can be quickly indicated.

9. Method of claim 8 in which step (e) involving repeating steps (c)–(d) is followed by the step of analyzing relative rates of magnetization relaxation as a function of time to thereby indicate fluid-flow properties of said sample.

10. The method of claim 8 in which said depolarizing code is stored on a sequential basis as control words each having informational fields previously generated via pseudo random numbers for determining both (i) next-in-time quiescent interval values, and (ii) orientation of the next-in-time depolarizing pulse of said depolarizing code whereby the magnetic moments of said nuclei of said sample are depolarized within a surprisingly short depolarizing period.

11. The method of claim 10 in which the polarizing period generated by said depolarizing code is in a range of 15–25 milliseconds.

* * * * *